US006624412B2

(12) United States Patent
Tanaka et al.

(10) Patent No.: US 6,624,412 B2
(45) Date of Patent: Sep. 23, 2003

(54) ENERGY FILTER

(75) Inventors: Michiyoshi Tanaka, 28-4, Yagiyama-honcho 2-chome, Taihaku-ku, Sendai, 982-0801 (JP); Masami Terauchi, Sendai (JP); Kenji Tsuda, Sendai (JP); Katsushige Tsuno, Tokyo (JP); Toshikazu Honda, Tokyo (JP)

(73) Assignees: Jeol Ltd., Tokyo (JP); Michiyoshi Tanaka, Sendai (JP)

( * ) Notice: Subject to any disclaimer, the term of this patent is extended or adjusted under 35 U.S.C. 154(b) by 177 days.

(21) Appl. No.: 09/897,767

(22) Filed: Jul. 2, 2001

(65) Prior Publication Data

US 2002/0017614 A1 Feb. 14, 2002

(30) Foreign Application Priority Data

Jul. 6, 2000 (JP) .................................... 2000-204744

(51) Int. Cl.[7] ............................................ H01J 37/14

(52) U.S. Cl. ...................... 250/305; 250/311; 250/397; 250/398; 250/396 ML; 250/396 R; 250/307; 250/310

(58) Field of Search ............................... 250/305, 311, 250/397, 398, 396 ML, 396 R, 307, 310

(56) References Cited

U.S. PATENT DOCUMENTS

| | | | | | |
|---|---|---|---|---|---|
| 5,449,914 | A | | 9/1995 | Rose et al. | 250/396 ML |
| 6,066,852 | A | * | 5/2000 | Taya et al. | 250/396 ML |
| 6,307,205 | B1 | * | 10/2001 | Tsuno | 250/396 ML |
| 6,441,378 | B1 | * | 8/2002 | Tsuno et al. | 250/396 ML |
| 6,501,076 | B1 | * | 12/2002 | Kelly et al. | 250/305 |

* cited by examiner

*Primary Examiner*—John R. Lee
*Assistant Examiner*—Zia R. Hashmi
(74) *Attorney, Agent, or Firm*—Webb Ziesenheim Logsdon Orkin & Hanson, P.C.

(57) ABSTRACT

An omega energy filter capable of increasing energy dispersion while canceling out second-order aberrations. The energy filter is mirror-symmetric with respect to the center plane C. A beam enters a first nonuniform magnetic field produced by a first magnet, then enters a second nonuniform magnetic field region produced by a second magnet. The trajectory of the beam is curved by the field produced by the second magnet. Finally, the beam enters a third magnetic field region produced by the first magnet. The beam is deflected in this region and reaches an exit slit.

5 Claims, 9 Drawing Sheets

ENERGY FILTER

BACKGROUND OF THE INVENTION

1. Field of the Invention

The present invention relates to an energy filter that is used in an energy analysis instrument employing a charged-particle beam to achieve high-energy resolution or energy-filtered imaging.

2. Description of the Related Art

In an electron microscope or the like, an omega filter (Ω-filter) or the like may be used as an imaging energy filter. It is desired to increase energy dispersion within the energy filter. The energy dispersion provided by an omega filter is generally increased with increasing the distance from the entrance window to the exit window (slit position). However, if this distance is increased, the whole instrument in which the filter is mounted is made bulky. Therefore, limitations are placed on increasing the distance between the entrance window and the exit window when attempting to increase energy dispersion.

Furthermore, the imaging energy filter needs to be mirror-symmetric with respect to the center plane to cancel out second-order aberrations. Therefore, it is difficult to adopt a procedure consisting of increasing the magnification in order to increase the energy dispersion. Consequently, the magnification is generally fixed at 1× between the entrance window and the exit window or between the entrance pupil and the exit pupil.

One available method for obtaining a large energy dispersion under the restrictions described above consists of introducing a field acting as a concave lens in the direction of dispersion to increase the deflection action and the focusing action owing to a uniform field without increasing the size. For example, the end surfaces (i.e., the surfaces on the entrance side and on the exit side) of magnetic polepieces for achieving a quadrupole field are tilted. With this method, however, as the tilt angle is increased, the amount of the second aberration increases. Furthermore, the accuracy of simulation made when the filter is designed deteriorates. Accordingly, the end-surface tilt angle is substantially restricted to within approximately 40°. As a result, the energy dispersion is only about 1 μm at an accelerating voltage of 200 kV where the filter size has practical dimensions.

Another method for increasing energy dispersion while canceling out second-order aberrations is to tilt the mutually opposite pole faces for creating a quadrupole field. FIGS. 6(A) and 6(B) schematically show the configuration of such an omega filter. FIG. 6(A) is a plan view of the omega filter, while FIG. 6(B) is a cross-sectional view taken on line III—III of FIG. 6(A). As shown in FIG. 6(B), the mutually opposite surfaces of magnetic polepieces 21 and 21' are tilted at a given angle along the optical axis O. The surfaces of magnetic polepieces 22 and 22' (piece 22' is not shown) are similarly tilted. The magnetic polepieces 21, 21', 22, and 22' form parts of a cone. The generatrix of the cone is indicated by 21*a* and 21*b*.

This geometry is effective in enhancing the energy dispersion in the omega filter. Furthermore, the amount of second-order aberration is smaller than where the end surfaces of magnetic polepieces are tilted.

Another energy filter for increasing energy dispersion is described in U.S. Pat. No. 5,449,914. FIG. 7 is a horizontal cross section schematically showing the structure of this energy filter. The energy filter shown in FIG. 7 is equipped with three sector magnets which have bottom magnetic polepieces 31, 32, and 33, respectively. The magnetic polepiece 31 of the first sector magnet has a pole face parallel to the pole face of the top magnetic polepiece and produces a uniform magnetic field. The pole faces of the second and third sector magnets are tilted similarly to the structure shown in FIG. 6(B). Accordingly, the second and third sector magnets produce nonuniform magnetic fields.

Referring still to FIG. 7, the trajectory of a beam incident along the optical axis 34 is bent through a large angle at a radius of rotation of R1 by the first sector magnet. Then, the beam vertically enters the nonuniform magnetic field region produced by the second sector magnet. The beam then passes into the nonuniform magnetic field region produced by the third sector field. The trajectory of the beam is deflected by the magnetic fields developed by the second and third sector magnets. The beam returns into the magnetic field produced by the first sector magnet. The trajectory of the beam is again bent through a large angle by the first sector magnet and reaches the exit slit.

In this structure, the trajectory of the beam incident on the energy filter is bent four times in total and so the length of the trajectory can be made large. Hence, the energy dispersion can be increased. Furthermore, it is possible to bend the trajectory by the first sector magnet such that the beam trajectory from the side of the entrance window and the beam trajectory directed toward the exit slit intersect each other. Consequently, the trajectory length can be increased further.

In this geometry, the two beam trajectories in the magnetic field developed by the first sector magnet need to intersect each other. This complicates the design conditions of the instrument, especially the design conditions of the first sector magnet. That is, this geometry is effective in suppressing increase in size of the energy filter. However, the structure for causing the two beam trajectories to intersect each other is rendered complex.

SUMMARY OF THE INVENTION

Accordingly, it is an object of the present invention to provide an energy filter that is relatively simple in structure and capable of providing increased energy dispersion while canceling out second-order aberrations.

An energy filter in accordance with the present invention is equipped with three magnetic field regions through which a charged-particle beam successively passes, and has the following features. The charged-particle beam first goes into and out of the first magnetic field region, where the beam has a radius of rotation of R1. The beam emerging from the first magnetic field region then passes through the second magnetic field region, where the beam has a radius of rotation of R2. The beam going out of the second magnetic field region finally passes through the third magnetic field region, where the beam has a radius of rotation of R1. The three magnetic field regions are so arranged that the optical axis of the beam incident on the first magnetic field region where the beam has the radius of rotation R1 and the optical axis of the beam emerging from the third magnetic field region where the beam has the radius of rotation of R1 are in line. In each of the three magnetic field regions, a nonuniform magnetic field that becomes intenser toward the center of rotation of the beam is produced.

Other objects and features of the invention will appear in the course of the description thereof, which follows.

DESCRIPTION OF THE PREFERRED EMBODIMENTS

Figure 1:
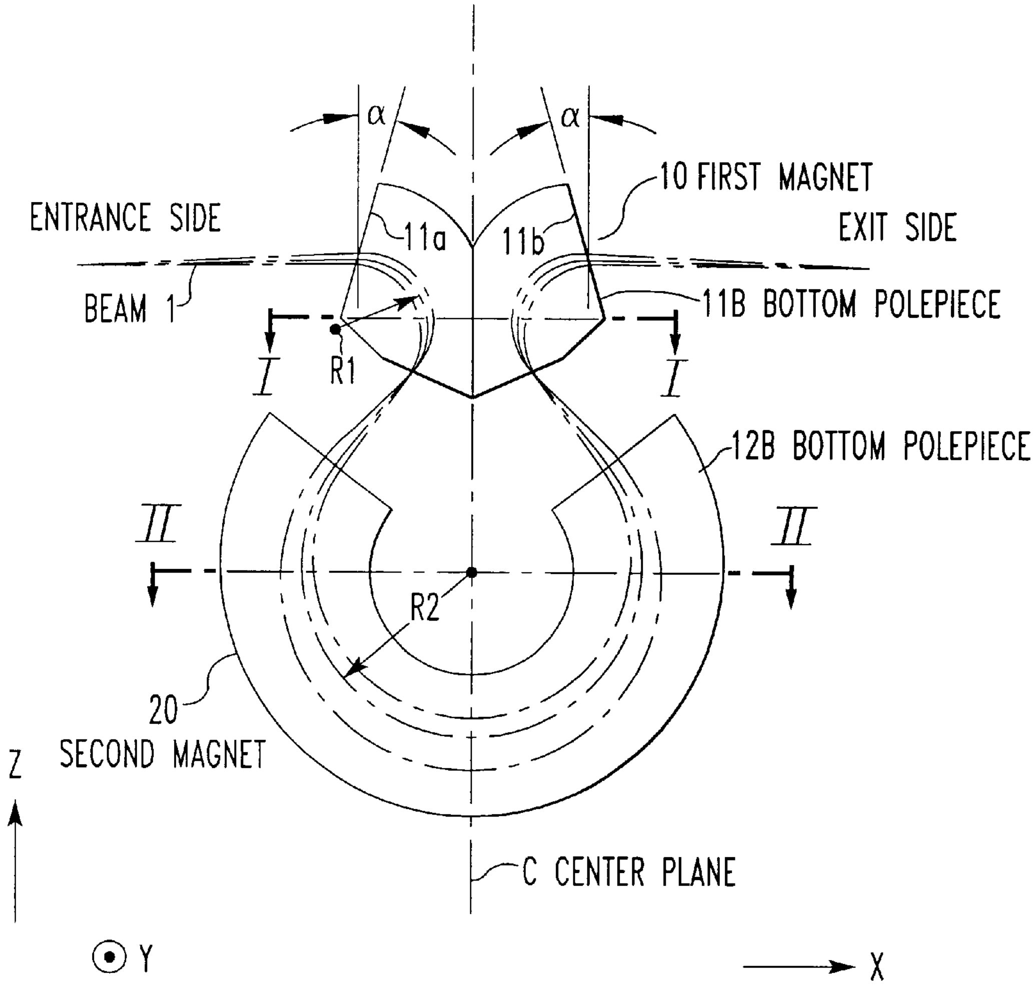
FIG. 1 is a plan view of an energy filter in accordance with the present invention.

FIG. 1 is a plan view showing the structure of an energy filter in accordance with the present invention. This filter has two electromagnets for producing three nonuniform magnetic fields. The electromagnets include a first magnet 10 and a second magnet 20. In FIG. 1, the bottom magnetic polepiece 11B of the first magnet 10 and the bottom magnetic polepiece 12B of the second magnet 20 are shown. The energy filter is so constructed as to be mirror-symmetric with respect to the center plane C, as shown in FIG. 1. The direction of the line indicating the center plane C is hereinafter referred to as the z-direction. The direction orthogonal to the z-direction within the plane of the paper is referred to as the x-direction. The direction orthogonal to the plane of the paper is referred to as the y-direction.

Figure 2B:
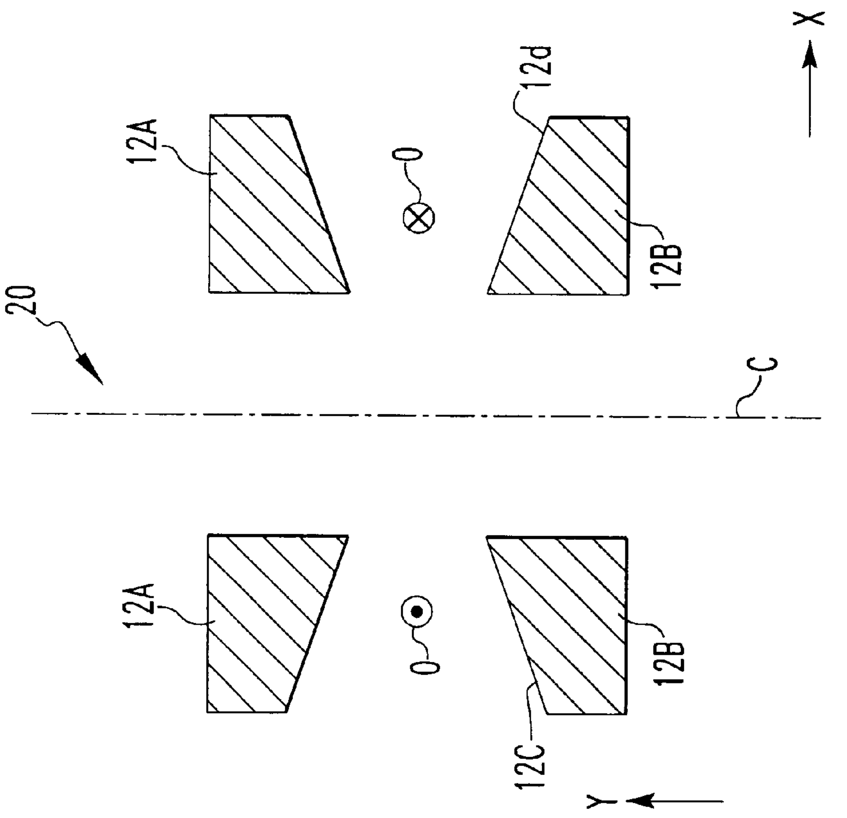
FIG. 2(B) is a cross-sectional view taken on line II—II of FIG. 1.
Figure 2A:
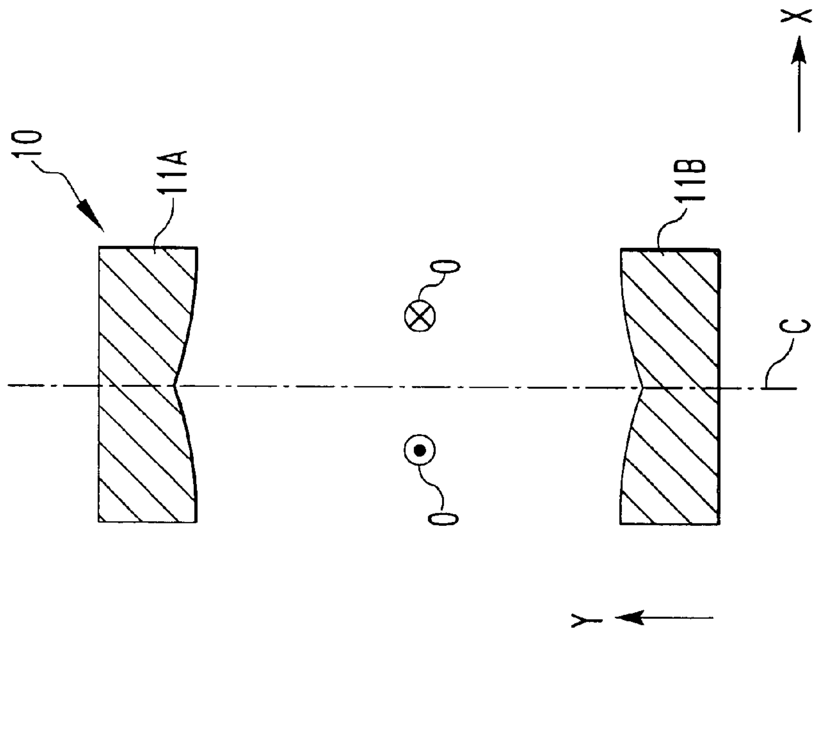
FIG. 2(A) is a cross-sectional view taken on line I—I of FIG. 1.

FIG. 2(A) is a cross-sectional view taken on line I—I of FIG. 1 showing the energy filter. FIG. 2(B) is a cross-sectional view taken on line II—II of FIG. 1. Note that the vertical scale is exaggerated ten times compared with the horizontal scale in FIG. 2(A). In FIG. 2(B), the vertical scale is exaggerated five times compared with the horizontal scale.

That is, in FIG. 2(A), the space between the top magnetic polepiece 11A and the bottom magnetic polepiece 11B of the first magnet 10 is shown to be wider than the actual space. In FIG. 2(B), the space between the top magnetic polepiece 12A and the bottom magnetic polepiece 12B of the second magnet 20 is shown to be wider than the actual space. In FIGS. 2(A) and 2(B), the optical axis along which the center beam passes is indicated by O.

Referring to FIG. 1, the end surfaces 11*a* and 11*b* of the polepieces of the first magnet which are on the incident side and on the exit side, respectively, are tilted at an angle of $\alpha$ from the plane vertical to the beam incidence direction and the beam exit direction.

The shapes of the magnetic polepieces of the first magnet 10 and the second magnet 20 are described in detail by referring to FIGS. 3(A)–3(J). FIGS. 3(A)–3(F) illustrate the shapes of the magnetic polepieces of the second magnet 20. FIGS. 3(G)–3(J) illustrate the shapes of the magnetic polepieces of the first magnet 10.

Figure 3A:
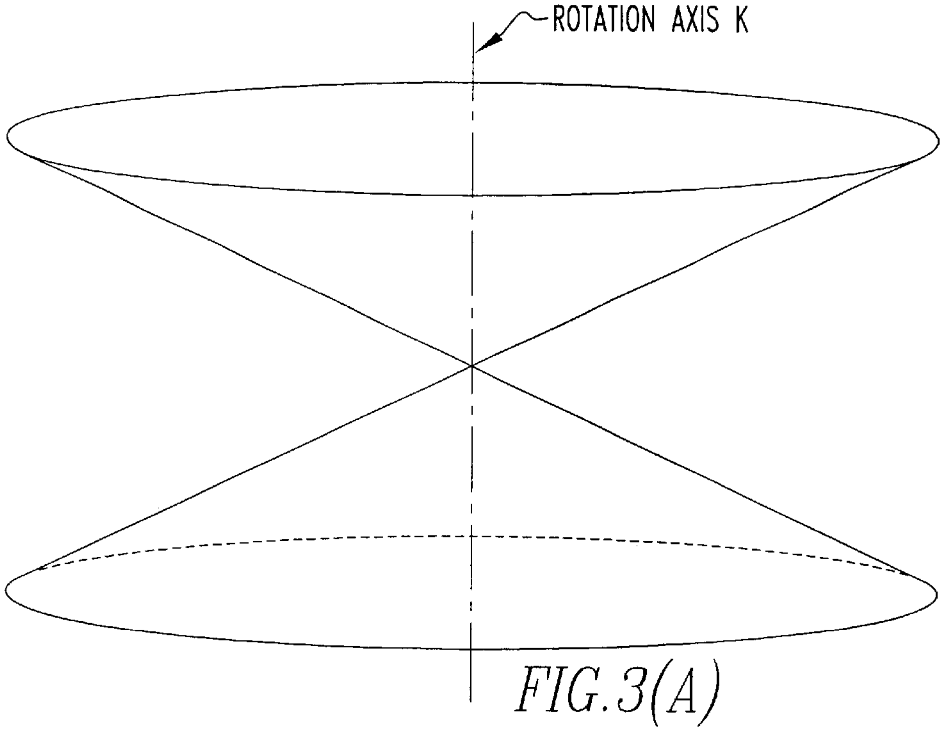
FIGS. 3(A)–3(J) are diagrams illustrating the geometries of the magnetic polepieces of a first magnet and a second magnet.
Figure 3B:
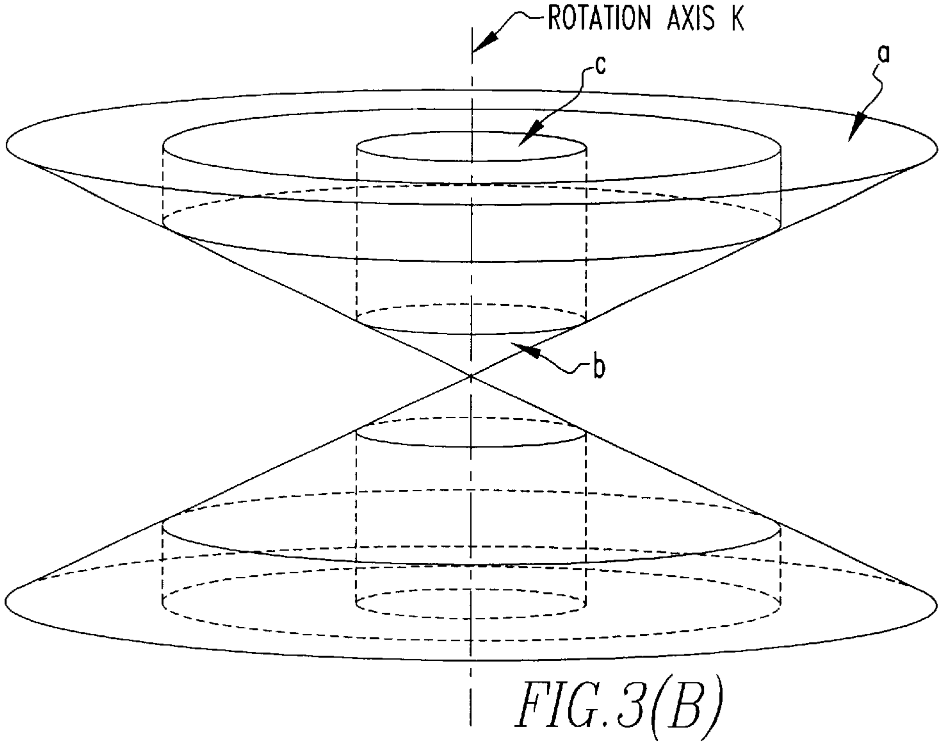
Figure 3C:
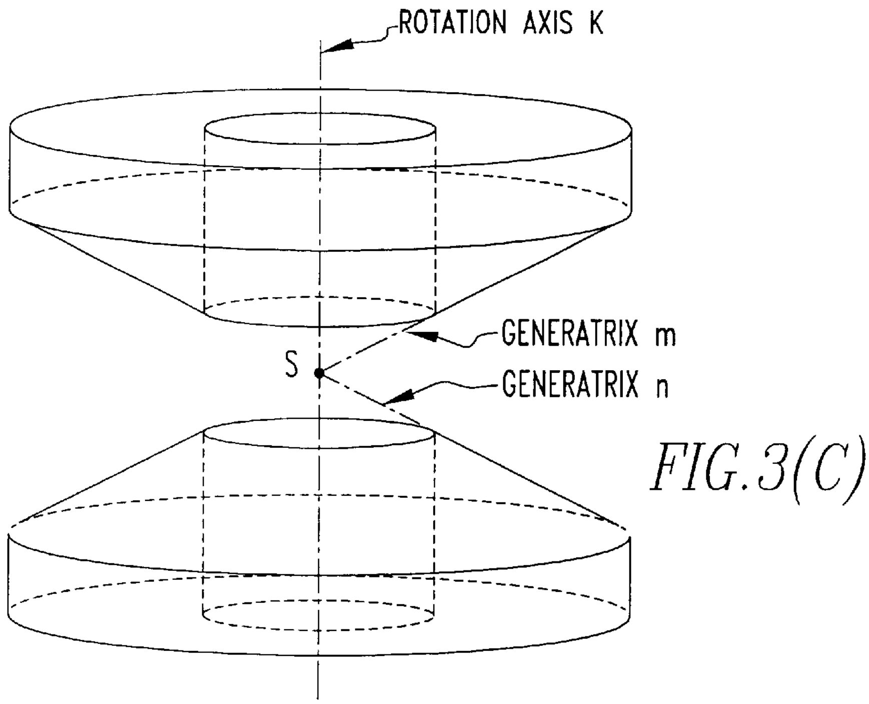

Referring to FIG. 3(A), a pair of upper and lower conic forms are formed around an axis of rotation k. Referring to FIG. 3(B), an outer portion a, a vertex portion b, and a central cylindrical portion c are removed from each cone. The resulting shapes are shown in FIG. 3(C). Of course, the intersection S of the generatrix m of the upper cone and the generatrix n passing through the portion of the lower cone opposite to the generatrix m exists on the axis of rotation k.

Figure 3D:
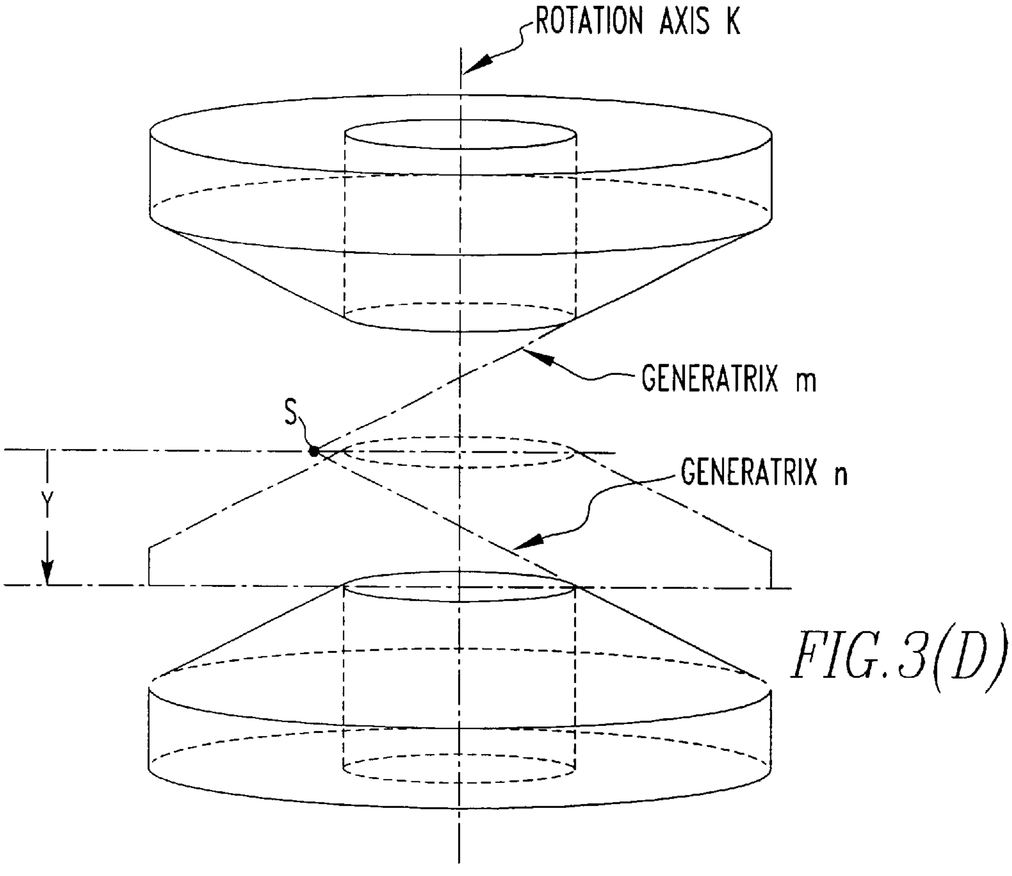
Figure 3E:
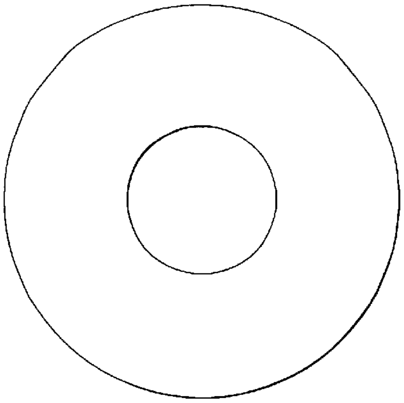
Figure 3G:
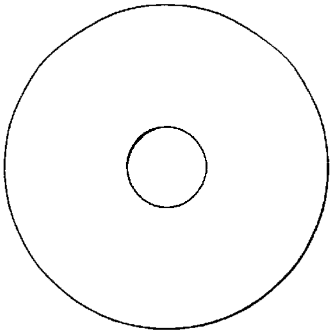

Then, as shown in FIG. 3(D), the distance between the two upper and lower cones is increased by Y compared with the distance existing in the case of FIG. 3(C). The resulting arrangement is shown in FIG. 3(D). At this time, the intersection S of the generatrix m of the upper cone and the generatrix n passing through the portion of the lower cone opposite to the generatrix m is located off the axis of rotation k. This intersection S off the axis of rotation k has an important meaning as described later. FIG. 3(E) is a plan view taken from above this geometric figure.

Figure 3F:
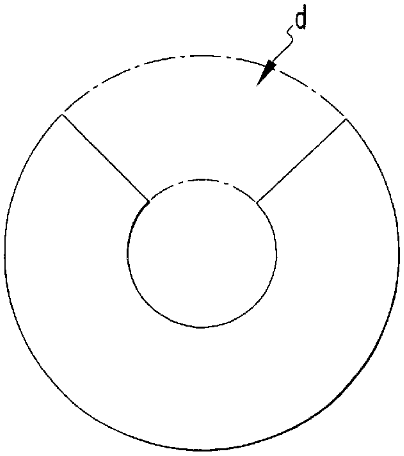

Then, as shown in FIG. 3(F), a sectorial portion d is removed from the figure shown in FIG. 3(E). As a result, the magnetic polepiece 12B and another magnetic polepiece 12A (not shown) of the second magnet 20 shown in FIG. 1 are obtained. FIG. 2(B) is a cross-sectional view of this pair of magnetic polepieces.

Figure 3H:
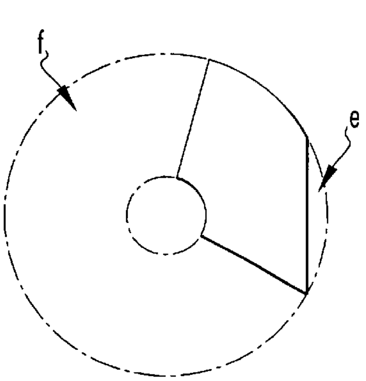
Figure 3I:
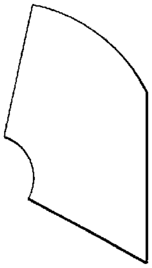
Figure 3J:
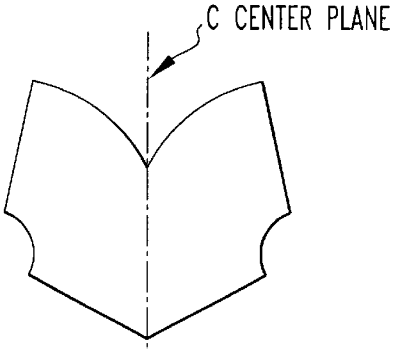

The magnetic polepieces of the first magnet 10 are shaped in the same way as in the process described in connection with FIGS. 3(A)–3(D). The resulting shapes of the magnetic polepieces are shown in the plan view of FIG. 3(G). Then, as shown in FIG. 3(H), an arc-shaped portion e and a sectorial portion f are removed from the shape of FIG. 3(G). The resulting shape is shown in FIG. 3(I). The obtained magnetic polepieces each having the shape of FIG. 3(I) are coupled together with a mirror symmetry with respect to the center plane C, as shown in FIG. 3(J). In consequence, the magnetic polepieces 11B and 11A (not shown) of the first magnet 10 shown in FIG. 1 are obtained.

Figure 6A:
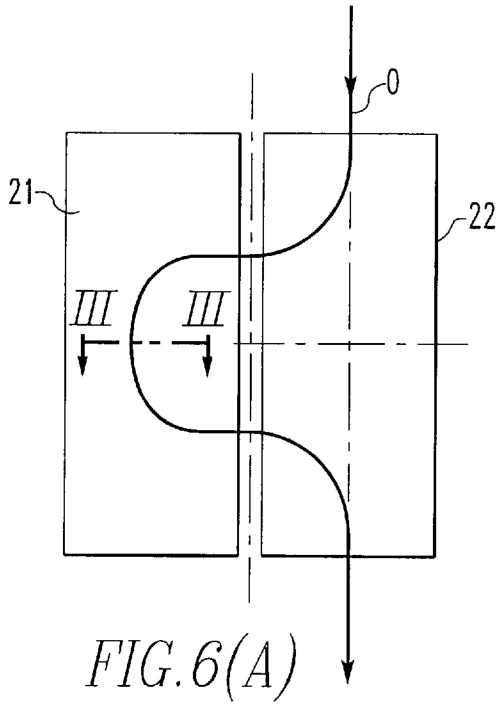
FIG. 6(A) PRIOR ART
FIG. 6(A) is a plan view of an omega filter.
Figure 6B:
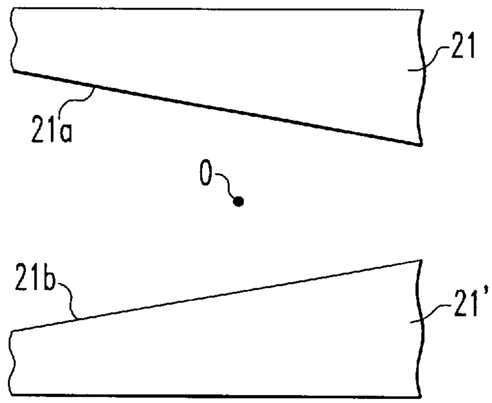
FIG. 6(B) PRIOR ART
FIG. 6(B) is a cross-sectional view taken on line III—III of FIG. 6(A)

The mutually opposite surfaces of the magnetic polepieces 11A, 11B of the first magnet 10 are tilted at a given angle along the optical axis O in the same way as in the structure shown in FIG. 6(B). In particular, those portions of the mutually opposite portions of the magnetic polepieces 11A and 11B which extend along the trajectory of the beam are obtained by cutting out portions of a pair of upper and lower conical surfaces. Accordingly, as shown in FIG. 2(A), the magnetic polepieces 11A and 11B of the first magnet 10 assume a slightly curved, V-shaped form that is symmetric with respect to the center plane on the cross section taken along line I—I. As a result, two nonuniform magnetic field regions are formed on the opposite sides of the center plane C between the magnetic polepieces 11A and 11B.

To facilitate the fabrication, those surface portions of the magnetic polepieces 11A and 11B which intersect with the center plane C may be rounded such that they are smoothly connected, because these intersecting portions are remote from the beam path and thus the effects of differences in shape can be neglected.

The beam 1 entering the first nonuniform magnetic field region produced by the first magnet 10 is deflected in a clockwise direction as viewed in FIG. 1 and then passes into the second nonuniform magnetic field region developed by the second magnet 20. Let R1 be the radius of the beam trajectory formed by the first magnet 10. The beam trajectory is deflected in a counterclockwise direction as viewed in FIG. 1 by the magnetic field region set up by the second magnet 20. The beam leaves the magnetic field region created by the second magnet 20 and enters the third nonuniform magnetic field region again produced by the first magnet 10. Let R2 be the radius of the beam trajectory formed by the magnet 20 in the second magnetic field region.

The beam entering the third nonuniform magnetic field region produced by the first magnet 10 is deflected again in a clockwise direction and then arrives at the exit window (exit slit). Since each of the first magnet 10 and the second magnet 20 is symmetric with respect to the center plane, the optical axis of the beam entering the energy filter is coincident with the optical axis of the beam going out of the filter. Also, second-order aberrations are canceled out.

Figure 7:
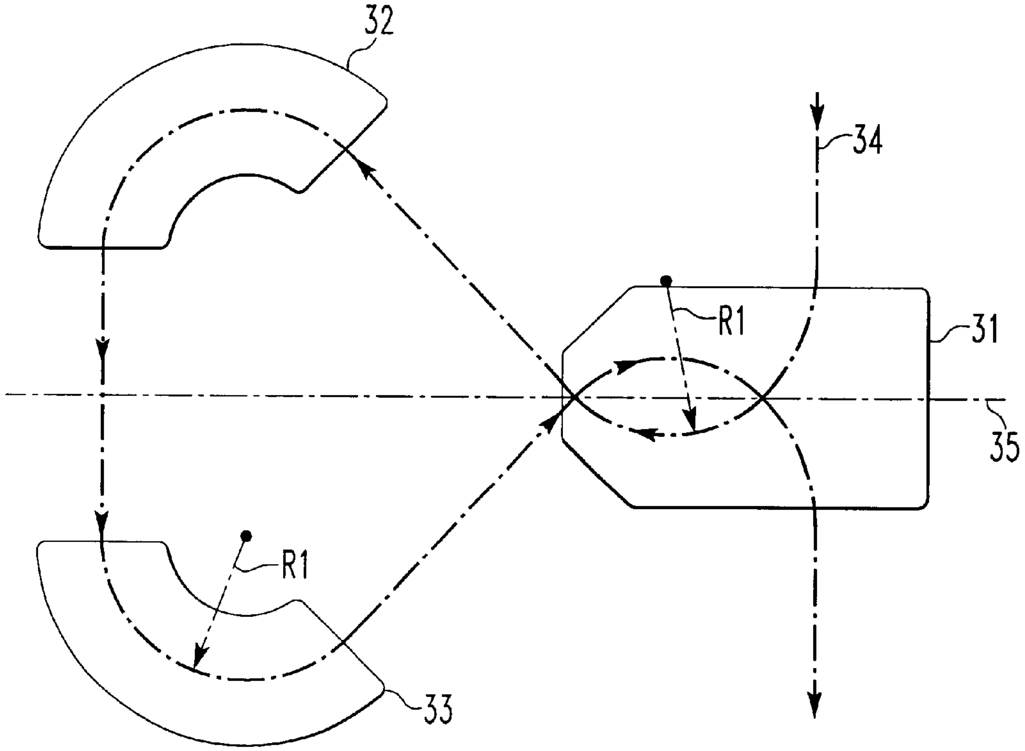
FIG. 7 PRIOR ART
FIG. 7 is a schematic diagram of the prior art energy filter.

In the structure shown in FIG. 7, there are four magnetic field regions, i.e., two regions produced by the first magnet, one region produced by the second magnet, and one region produced by the third magnet. It can be said that the instrument in accordance with the Applicants' invention has three magnetic field regions, i.e., two regions produced by the first magnet 10 and one region produced by the second magnet 20.

In the configuration described thus far, the beam trajectory has the radius R1 in the first and third magnetic field regions produced by the first magnet 10. In the second magnetic field region produced by the second magnet 20, the beam trajectory has the radius R2. As this radius R2 in the second magnetic field is increased relative to the radius R1, the energy dispersion is increased. Accordingly, in this embodiment, the second magnet 20 is made larger than the first magnet 10 to set the radius R2 larger than the radius R1.

The mutually opposite pole faces of the first magnet 10 and the second magnet 20 are tilted, and the end surfaces of the magnetic polepieces which are on the entrance side and on the exit side, respectively, are tilted in the manner described below.

Figure 4:
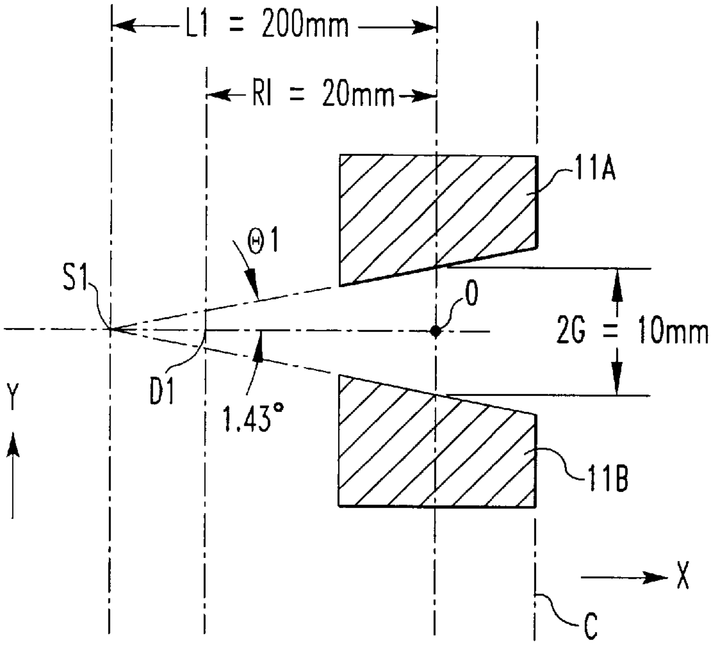
FIG. 4 is a diagram illustrating tilt of the pole faces.

FIG. 4 is a cross-sectional view of the portions of the magnetic polepieces 11A, 11B of the first magnet 10 which are to the left of the center plane C. The beam 1 passes between these portions. In FIG. 4, the intersection of the generatrix m of the upper cone and the generatrix n passing through the portion of the lower cone opposite to the generatrix m in the arrangement of FIG. 3(D) is indicated by S1. Let L1 be the distance between the intersection S1 and the optical axis O along which the center of the beam passes. The shapes of the magnetic polepieces 11A and 11B are determined based on this intersection S1. We now introduce a relation L1=R1/n1, where R1 is the radius of rotation of the beam 1, i.e., the distance between the center of rotation D1 and the optical axis O, and n1 is a parameter determining the degree of tilt. Where n1=1, the intersection S1 is coincident with the center of rotation D1. In this embodiment, the radius of rotation R1 of the beam 1 is 20 mm, and the space 2G between the magnetic polepieces 11A and 11B (at the location of the optical axis O) is 10 mm. Where n1=0, the magnetic pole faces are planes perpendicular to the xy-plane.

Where n1=0.5, a well-known round lens condition holds, i.e., the focusing condition in the direction of the magnetic field and the focusing condition in the direction perpendicular to the magnetic field are simultaneously satisfied. Under this condition, the beam 1 can be focused with axial symmetry like an axially symmetrical lens, even if the end surfaces 11*a*, 11*b* of the magnetic polepieces 11A, 11B are not tilted. That is, focusing effect can be produced in the direction of the magnetic field and in the perpendicular direction without giving tilt to the end surfaces.

The portions of the magnetic polepieces 11A and 11B of the first magnet 10 which are to the left of the center plane C are tilted in the same way as in the structure shown in FIG. 4.

Figure 5:
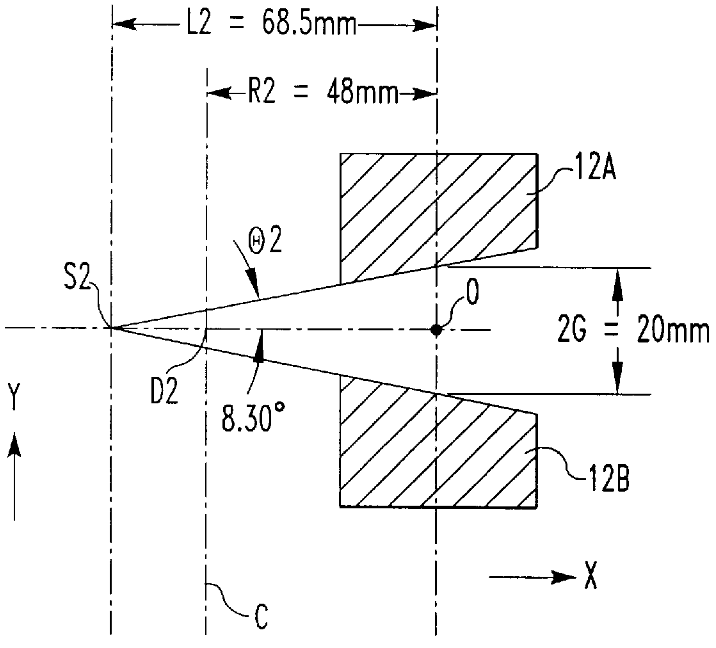
FIG. 5 is a diagram illustrating tilt of the pole faces of a second magnet.

FIG. 5 is a cross-sectional view of the portions of the magnetic polepieces 12A and 12B of the second magnet 20 which are to the right of the center plane C. The beam 1 passes between these portions. The mutually opposite portions of the magnetic polepieces 12A and 12B which extend along the beam trajectory are so shaped that parts of the conical surfaces of a pair of upper and lower cones are cut out. In FIG. 5, the intersection of the generatrix m of the upper cone and the generatrix n passing through the portion of the lower cone opposite to the generatrix m in the arrangement of FIG. 3(D) is indicated by S2. The shapes of the magnetic polepieces 12A and 12B are determined based on this intersection S2. Let L2 be the distance between the optical axis O along which the center of the beam 1 passes and the intersection S2. We introduce a relation L2=R2/n2, where R2 is the radius of rotation of the beam 1, and n2 is a parameter determining the degree of tilt. Where n2=1, the intersection S2 is coincident with the center of rotation D2. In this embodiment, the radius of rotation R2 of the beam 1 is 48 mm. The space 2G between the magnetic polepieces 12A and 12B at the location of the optical axis O is 20 mm.

Those portions of the magnetic polepieces 12A and 12B of the second magnet 20 which are to the left of the center plane C are tilted in the same way as in the structure shown in FIG. 5.

Large dispersions are obtained by setting the tilt of the pole faces of the first magnet 10 to such a value that n1 is smaller than the round lens condition, i.e., 0.5, and setting the tilt of the pole faces of the second magnet 20 to such a value that n2 is greater than the round lens condition, i.e., 0.5. That is, n1<0.5 and n2>0.5, where n1 assumes a value greater than 0.

In the example shown in FIG. 4, R1=20 mm and the tilt angle of the pole faces θ1=1.43°. This leads to tan θ1=tan (1.43°)=L1/G. Thus, L1=200 mm. Consequently, n1=0.1.

In the example shown in FIG. 5, R2=48 mm and the tilt angle of the pole faces θ2=8.30°. Thus, tan θ2=tan (8.30°)=L2/G. This gives rise to L2=68.5 mm. In consequence, n2=0.7.

Since the pole faces of the second magnet 20 are tilted at a greater angle, the beam is converted more greatly in the direction of the magnetic field (in the y-direction) than in the direction (x-direction) perpendicular to the magnetic field. Accordingly, in order that the beam be focused with an axial symmetry over the whole energy filter, the degrees of focusing of the beam within the field produced by the first magnet 10 must be reversed. However, on the first magnet 10, the pole faces are tilted at a smaller angle (n1<0.5). Therefore, the beam must be focused to a greater extent in the direction perpendicular to the magnetic field by another method.

Accordingly, in the present embodiment, the degree of focusing of the beam in the direction perpendicular to the magnetic field is increased depending on the tilt angle α of the end surfaces 11*a* and 11*b* of the magnetic polepieces of the first magnet 10. Specifically, the tilt angle α of the end surfaces 11*a* and 11*b* of the first magnet 10 is so selected that the beam is diverged more in the direction of the magnetic field and converged more in the direction of energy dispersion (i.e., in the direction perpendicular to the magnetic field). In this way, the degree of focusing done by the second magnet 20 is compensated for. This makes it unnecessary to control the convergence of the beam according to the tilt angle of the end surfaces of the magnetic polepieces of the second magnet 20. The end surfaces of the magnetic polepieces of the second magnet are formed in such a way that the beam incidence/exit direction and the end surfaces of the polepieces of the second magnet are substantially perpendicular to each other (i.e., at a tilt angle of a few degrees or less).

The tilt angle α of the end surfaces 11*a* and 11*b* of the polepieces of the first magnet 10 is adjusted according to the degree of tilt of the pole faces of the second magnet 20 indicated by the parameter n2. In other words, more latitude is allowed in selecting the parameter n2. That is, the parameter n2 that makes it possible to increase the energy dispersion while maintaining the axial symmetry of the beam focusing over the whole energy filter can be easily selected.

Figure 8:
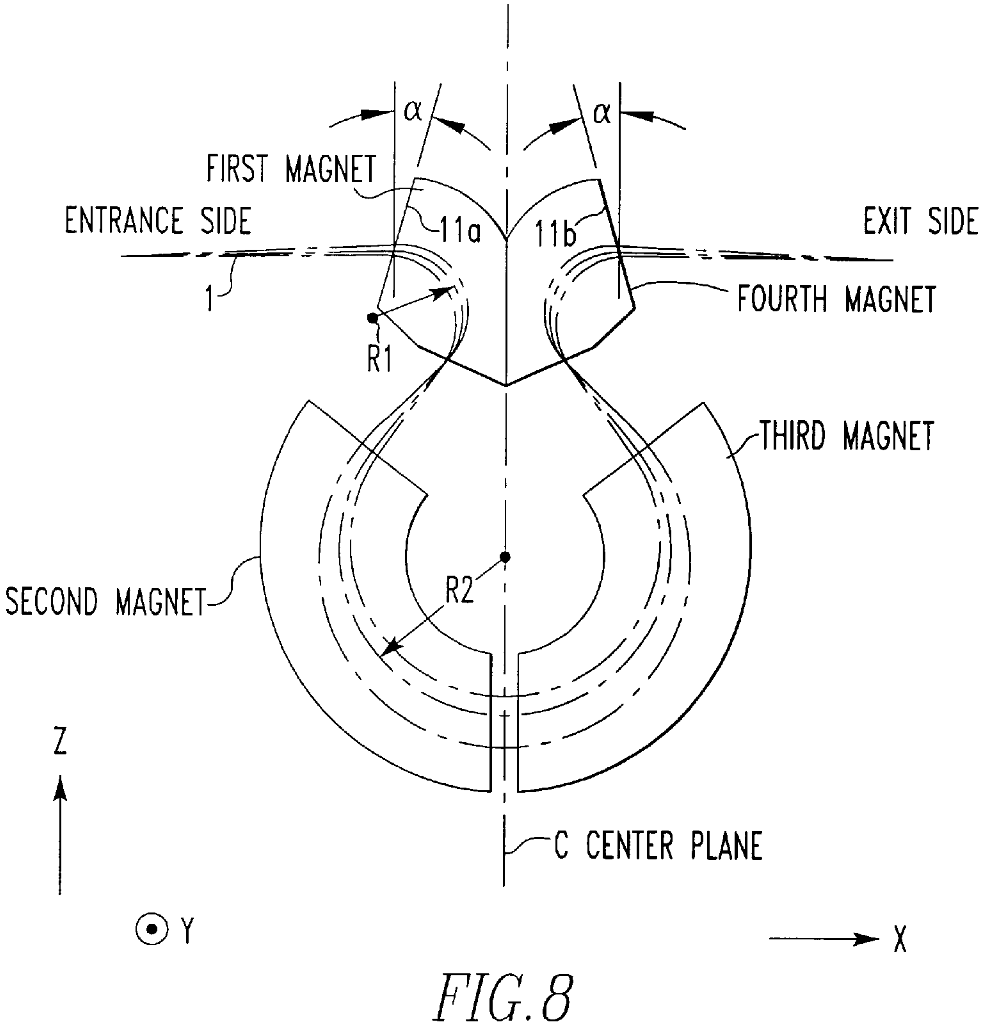
FIG. 8 is a plan view of another energy filter in accordance with the present invention.

The second magnetic field region in the above-described embodiment may be divided into two subregions along the center plane C (see FIG. 8). In this case, the total number of magnetic field regions is four. Furthermore, in the above embodiment, the single first magnet 10 produces the two magnetic field regions, i.e., the first and third field regions. The magnetic polepieces 11A and 11B may be divided along the center plane C to produce two magnetic regions by separate magnets.

As described thus far, the present invention provides an energy filter having first, second, and third magnetic field regions through which a charged-particle beam successively passes, the beam having a radius of rotation of R1, a radius of rotation of R2, and a radius of rotation of R1 in the first, second, and third magnetic field regions, respectively. These three magnetic field regions are so arranged that the optical axis of the beam incident on the first magnetic field region where the beam has the radius of rotation R1 and the optical axis of the beam exiting from the third magnetic field region where the beam has the radius of rotation of R1 are in line. In each of the three magnetic field regions, a nonuniform magnetic field that becomes intenser toward the center of rotation of the beam is produced. Consequently, the energy dispersion can be increased.

Having thus described our invention with the detail and particularity required by the Patent Laws, what is desired protected by Letters Patent is set forth in the following claims.

What is claimed is:

1. An energy filter having first, second, and third magnetic field regions through which a charged-particle beam successively passes, said energy filter comprising:

said first magnetic field region that said beam first enters and exits, said beam exhibiting a radius of rotation of R1 in said first magnetic field region;

said second magnetic field region that said beam going out of said first magnetic field region then enters and exits, said beam exhibiting a radius of rotation of R2 in said second magnetic field region;

said third magnetic field region that said beam going out of said second magnetic field region finally enters and exits, said beam exhibiting a radius of rotation of R1 in said third magnetic field region;

said first, second, and third magnetic field regions being so arranged that the optical axis of the beam incident on said first magnetic field region where the beam exhibits the radius of rotation of R1 and the optical axis of the beam emerging from said third magnetic field region where the beam exhibits the radius of rotation of R1 are in line; and wherein a nonuniform magnetic field that becomes continuously intenser toward the center of rotation of the beam is produced in each of said first, second, and third magnetic field regions.

2. The energy filter of claim 1, wherein pole faces mounted opposite to each other to form said three magnetic field regions are so shaped that they are parts of conical surfaces of a pair of cones.

3. The energy filter of claim 2, wherein pole faces in said three magnetic field regions are tilted to satisfy relations $$0<n1<0.5 \text{ and } n2>0.5$$

provided that (A) the intersection of mutually opposite generatrices of a pair of cones for determining shapes of magnetic polepieces in said first and third magnetic field regions where the beam exhibits the radius of rotation of R1 is given by S1, (B) a distance L1 between said intersection S1 and the central orbit of said beam being expressed in terms of R1, said distance L1 is R1/n1 or n1=R1/L1, (C) the intersection of mutually opposite generatrices of a pair of cones for determining shapes of magnetic polepieces in said second magnetic field region where the beam exhibits the radius of rotation of R2 is given by S2, and (D) the a distance L2 between said intersection S2 and the central orbit of said beam being expressed in terms of R2, said distance L2 is R2/n2 or n2=R2/L2.

4. The energy filter of claim 3, wherein entrance and exit end surfaces of said magnetic polepieces in said first and third magnetic field regions where said beam exhibits the radius of rotation of R1 are tilted with respect to a plane perpendicular to the direction in which said beam enters and exits, whereby said beam is converged more in the direction of energy dispersion and dispersed more in a direction perpendicular to the direction of energy dispersion.

5. The energy filter of any one of claims 1–4, wherein said second magnetic field region where said beam exhibits the radius of rotation of R2 is divided into two magnetic field subregions.

* * * * *